United States Patent [19]

Bakermans

[11] 4,354,720
[45] Oct. 19, 1982

[54] CONNECTOR ASSEMBLY HAVING IMPROVED LATCHING MEANS

[75] Inventor: Johannes C. W. Bakermans, Harrisburg, Pa.

[73] Assignee: AMP Incorporated, Harrisburg, Pa.

[21] Appl. No.: 198,675

[22] Filed: Oct. 20, 1980

[51] Int. Cl.³ ............................................. H01R 13/62
[52] U.S. Cl. .............................. 339/91 R; 339/17 CF
[58] Field of Search ........... 339/75 MP, 91 R, 17 CF, 339/174, 176 MP

[56] References Cited

U.S. PATENT DOCUMENTS 3,771,109 11/1973 Bruckner et al. .................... 339/174
3,831,131 8/1974 Woodcock et al. ............ 339/17 CF
4,220,383 9/1980 Sheingold et al. ............. 339/17 CF Primary Examiner—Eugene F. Desmond
Attorney, Agent, or Firm—Frederick W. Raring

[57] ABSTRACT

A connector assembly for an integrated circuit package comprises a rectangular housing having an IC package receiving face and having contacts therein which engage and contact terminal pads on a substrate positioned on the IC receiving face. A clamping lid is hinged to the housing and serves to clamp the substrate against the contact terminals in the housing to ensure good electrical contact. An improved latching means is disclosed for retaining the clamping lid in its closed position.

6 Claims, 7 Drawing Figures

CONNECTOR ASSEMBLY HAVING IMPROVED LATCHING MEANS

FIELD OF THE INVENTION

This invention relates to electrical connectors of the type intended to receive an integrated circuit package and having contact terminals therein for engagement with the terminal pads on the substrate of the circuit package. A connector in accordance with the invention has an improved latching means for latching the clamping lid of the connector against the housing and in clamping engagement with the substrate of the IC package.

BACKGROUND OF THE INVENTION

Integrated circuits are commonly packaged by mounting the IC chip on a rectangular insulating substrate having conductors on one surface thereof which extend to the marginal side portions of the substrate. The terminal areas of the integrated circuit chip are electrically connected to these conductors so that connections can then be made to external circuitry by mounting the IC package in a connector containing contact terminals which engage the terminal pads on the substrate.

A commonly used type of connector for IC packages of the type described above is shown in U.S. Pat. No. 4,220,383 and comprises a generally rectangular insulating housing having contact terminals therein which engage the terminal pads of the substrate when the substrate is positioned and clamped against one face of the housing. A clamping lid is provided on the housing which serves to firmly clamp the substrate against the contact terminals thereby to ensure that each contact terminal will bear against its associated pad on the substrate with a force sufficient to ensure a good electrical connection. The clamping lids in many instances are hinged to the connector housing so that the integrated circuit can easily be placed in, or removed from, the connector and a latching means is provided on the housing for maintaining the lid in its closed position on the housing.

The clamping force exerted by the clamping lid on the substrate is extremely high relative to the size of the substrate and the connector housing and the latching means must therefore be capable of maintaining the clamping lid in its closed position notwithstanding the fact that the latching means itself is of extremely small size. Known types of latching means for clamping lids of connectors will function adequately if they are carefully manufactured and installed on the connector housing, and if they are handled carefully by the technician when an integrated circuit package is placed in or removed from the connector. However, the commonly used types of latches for connector clamping lids, such as the latching means disclosed in the above identified U.S. Patent, will not withstand careless or abusive handling and are easily damaged when an IC package is placed in, or removed from, the connector if the technician does not exercise a high degree of care. If the latch is damaged, it may be completely incapable of latching the lid to the housing, or it may be damaged to the extent that its effectiveness in clamping the lid to the housing is reduced so that as a result of subsequent vibration or other physical disturbance, such as jarring, it may release its grip upon the clamping lid and thereby result in failure of the apparatus with which the IC package is being used.

The present invention is directed to an improved latching means and an IC connector clamping lid which is capable of withstanding abusive handling, which is not easily damaged, and which, if damaged as the result of gross abuse, will fail completely so that it will immediately be apparent that it must be replaced.

A latching means in accordance with the present invention comprises a stamped and formed sheet metal member mounted on one side of the connector housing adjacent to the IC package receiving face of the housing. An ear extends normally of the IC receiving face and a pair of latch arms extend in opposite directions from this ear along the side of the housing. The free ends of these arms are inwardly formed so that they overlie, but are spaced from, the IC receiving face of the housing. The arms are of sheet metal, as mentioned above, and are disposed in a plane which extends normally of the plane of the IC receiving face of the connector so that these arms can therefore easily be flexed away from the connector housing, that is, they can be flexed normally of their own planes, but they are highly resistant to flexure in a direction parallel to their planes. The edges of the free ends of the arms thus serve as latches for the lid, since these edges extend over the marginal portions of the lid when it is in covering relationship to an IC package in the connector. The ease with which the arms can be flexed normally on their own planes facilitates placement of an IC package in the connector and removal of the package from the connector.

PRACTICE OF THE INVENTION

Figure 1:
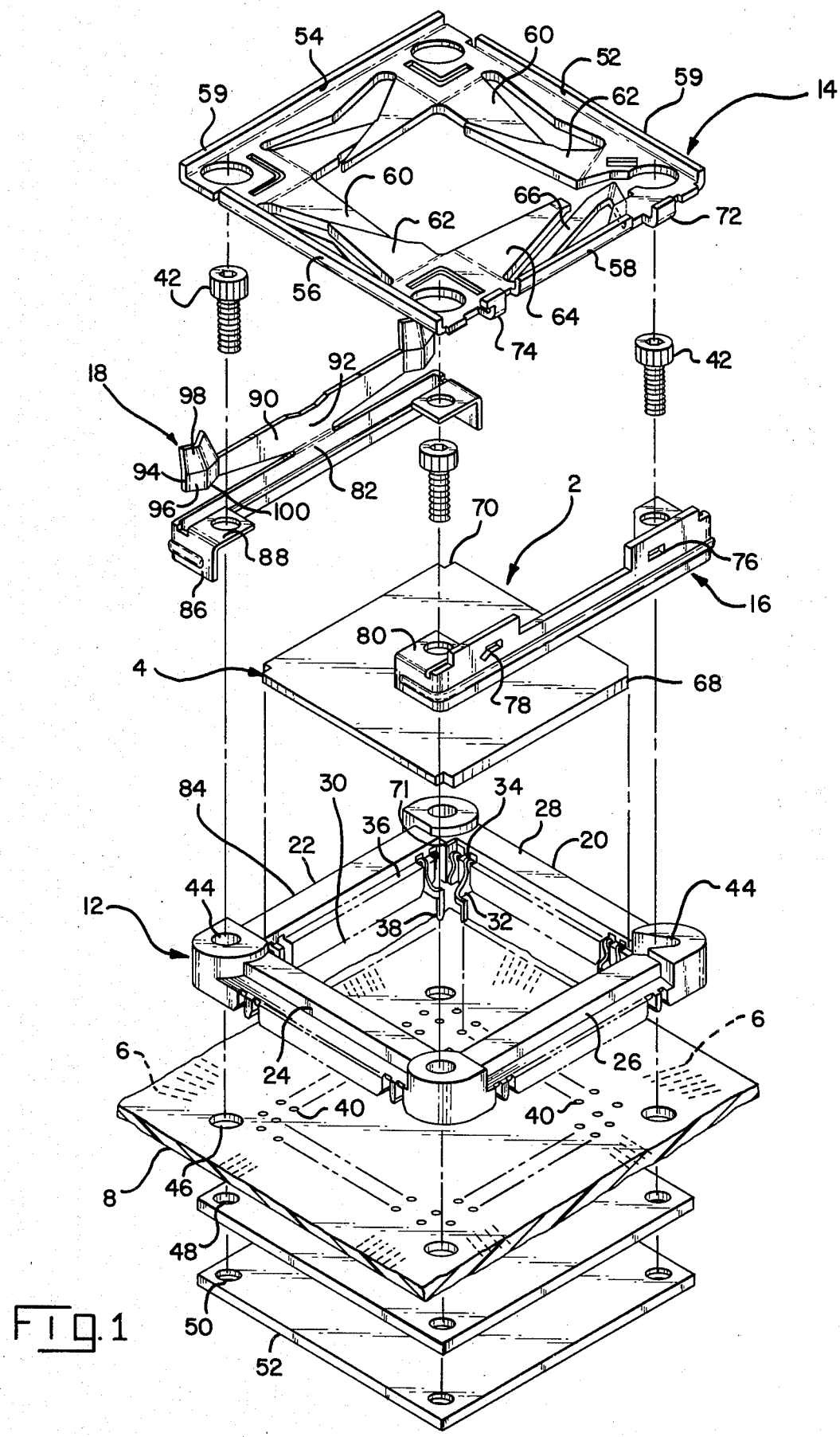
FIG. 1 is a perspective view of a connector in accordance with the invention with the parts exploded from, and in alignment with, each other.
Figure 2:
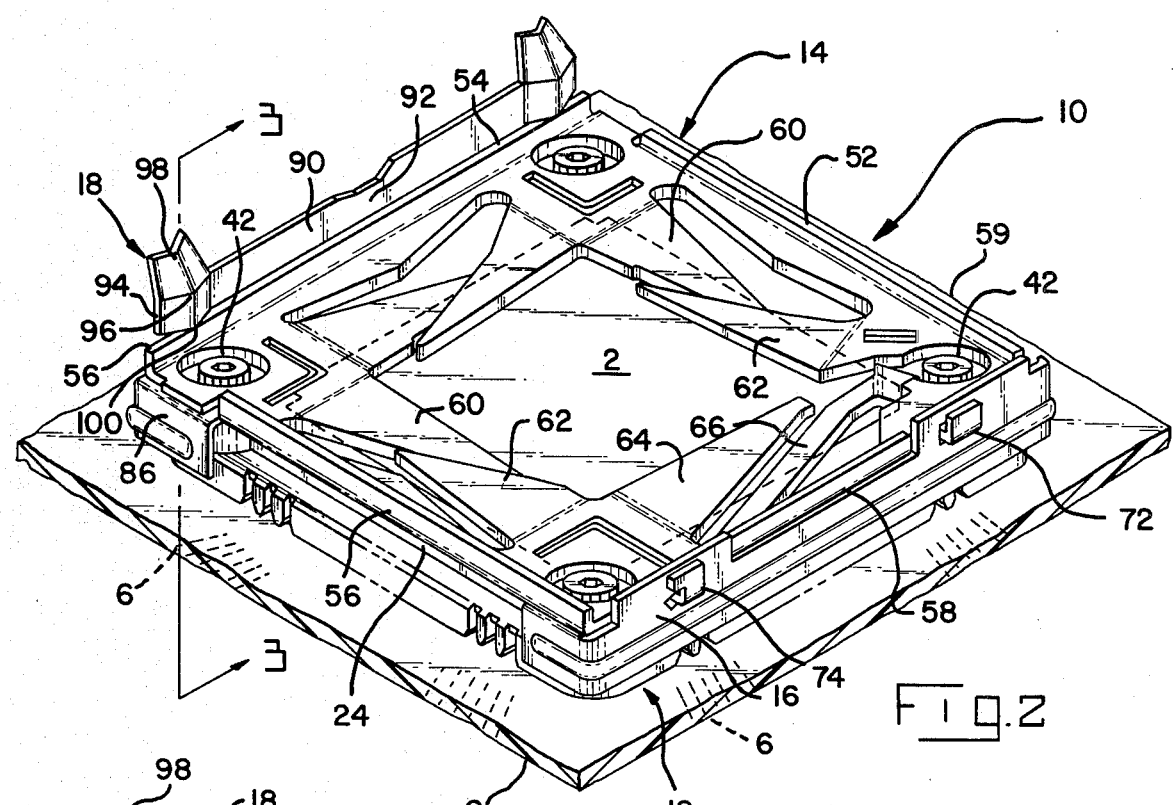
FIG. 2 is a perspective view of the connector assembly mounted on a circuit board and with an IC package contained in the connector.
Figure 3:
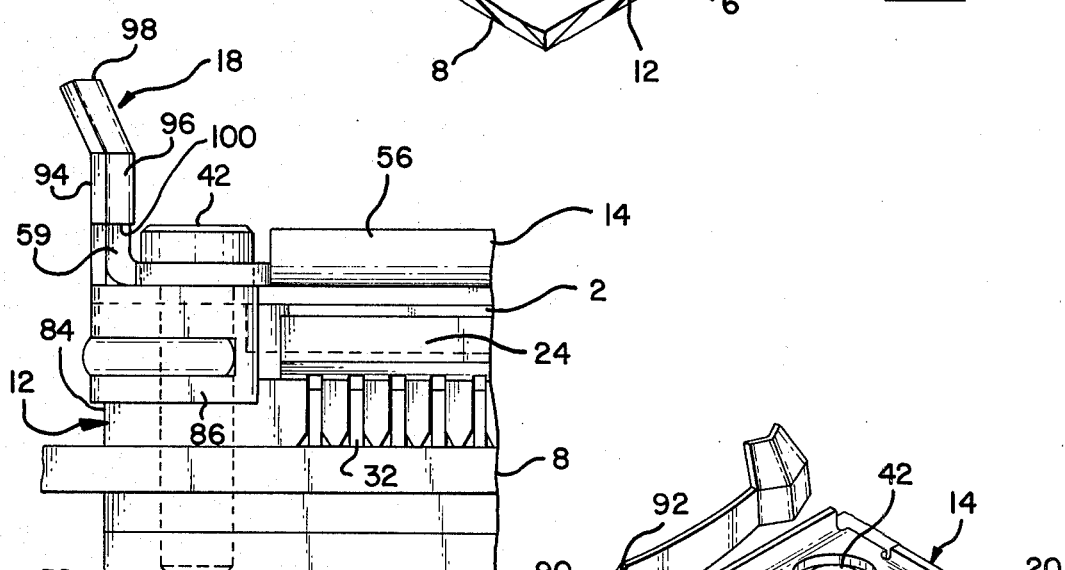
FIG. 3 is a view taken along the lines 3—3 of FIG. 2.

A connector assembly in accordance with the invention serves to connect terminal pads on the underside of a substrate 4 of an integrated circuit package 2 to conductors 6 on the underside of a circuit board 8. The entire connector assembly 10, FIG. 2, is mounted on the upper surface of the circuit board when the connector is in use with the substrate contained in the connector assembly.

The connector assembly comprises the rectangular insulating housing 12, a clamping lid 14, a hinge frame 16, by means of which the lid is hinged to the housing, and a latch frame 18 having integral latch arms for latching the lid in its lowered or closed position.

The rectangular housing 12 comprises four side rails 20, 22, 24, and 26 and is centrally open as shown. The upper surface 28, as viewed in the drawing, of the housing 12 functions as an IC package receiving face and a plurality of contact terminals 32 are provided in the side rails of the housing for engagement with the terminal pads on the underside of the substrate 4. Each contact terminal has a contact portion 34 which projects above a substrate supporting ledge 36 on the inside of each side rail. Each contact further has a depending solder tab portion 38 which is dimensioned to be received in a hole 40 in the circuit board 8 so that the lower ends of these solder tabs can be soldered to the conductors 6 on the underside of the circuit board. The housing and, as will be explained below, the hinge frame and the latch frame, are secured to the circuit board by means of screws 42 which extend through openings 44 in the corners of the housing 12, openings 46 in the circuit board 8, openings 48 in an insulator plate, and are into threaded holes 50 in a metallic supporting plate 52. This supporting plate is required in order to relieve the circuit board 8 of the considerable stresses which are imposed as the result of the high forces developed by the contact terminals in the connector.

The clamping lid 14 comprises a flat stamped and formed member of sheet metal having good spring properties, such as a spring steel. The lid is generally rectangular having four side rails 52, 54, 56, and 58, these side rails having upwardly direction flanges 59 on their outer ends for stiffening purposes. Each of the side rails 52, 54, 56 has a pair of clamping springs 60, 62 associated therewith and the side rail 58 has clamping spring 64 associated therewith. A biasing arm 66 is also provided adjacent to the side rail 58 and this biasing arm has a downwardly turned free end which engages a beveled corner 68 of the substrate 4. The remaining corners of the substrate are notched, as shown at 70, so that when the clamping lid is lowered against the housing, the free end of the arm 66 engages the corner 68 of the substrate and biases it to a predetermined position in the well 30 of the housing, such that wedges in the corners of the well, as shown at 71, enter the notches 70 in the remaining corners of the substrate.

The particular clamping lid shown in the drawing is of the type fully disclosed and claimed in my co-pending U.S., Application Ser. No. 197,402 filed Oct. 16 1980. It will be understood that a latching means in accordance with the present invention, as will now be described, can be used with types of clamping lids other than that shown in the drawing.

The clamping lid 14 is hinged to the housing by means of hinge ears 72, 74 extending from the side rail 58 which are received in openings 76, 78 in the hinge frame 16. The ear 72 is a simple L-shaped ear which is dimensioned to enter the rectangular hole 76, while the ear 74 has a lateral extension at its free end and the corresponding hole 78 has a similar extension. This arrangement ensures that the lid will not be easily removed from the hinge frame during ordinary use. The hinge frame has inwardly directed flanges at its ends and ears 80 extend inwardly from these flanges and the upper face of the housing, the ears 80 having openings therein for the screws 42, as previously noted.

The latch frame 18 comprises a generally rectangular strip of sheet metal 82 which is disposed against the laterally facing outside surface 84 of the housing 12. Inwardly directed flanges 86 on the ends of the strip 82 extend over the adjacent surfaces of the housing and ears 88 extend over the face of the housing in the same manner as the ears 80.

An ear 92 extends upwardly, as viewed in the drawing, from the upper edge of the strip 82 and latch arms 90 extend in opposite directions, cantilever fashion, from this ear. These latch arms thus comprise sheet metal members having their planes extending vertically, as viewed in the drawing and normally of the plane of the IC receiving face 30 of the housing. The ends 94 of the latch arms 90 are inwardly formed, as shown at 96, to provide a portion of a cylindrical surface which extends inwardly and past the plane of the surface 84 of the housing. The latch arms are also of decreasing width with increasing distance from the ear 92 so that the lower edge 100 of each latch arm is spaced from the strip 84 at the free ends 94. Camming surfaces, as shown at 98, extend upwardly from the free ends of the latch arm and are inclined outwardly and away from the plane defined by the latch arms 90. These camming surfaces cooperate with the edge of the side rail 54 when the lid is lowered, as will be explained below.

Figure 4:
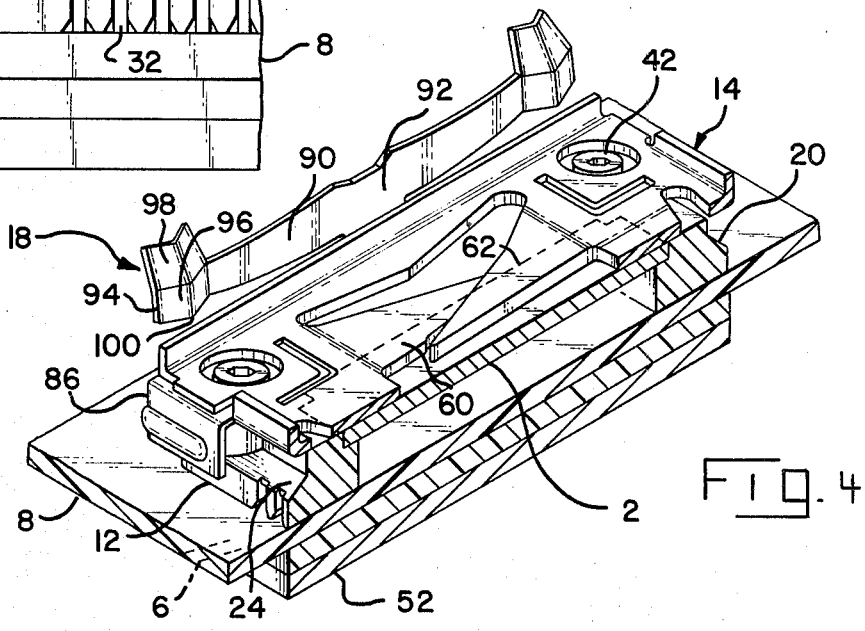
FIG. 4 is a view similar to FIG. 2 but showing the latch arms in a flexed condition so that the lid can be raised from the IC receiving face of the connector housing.
Figure 5:
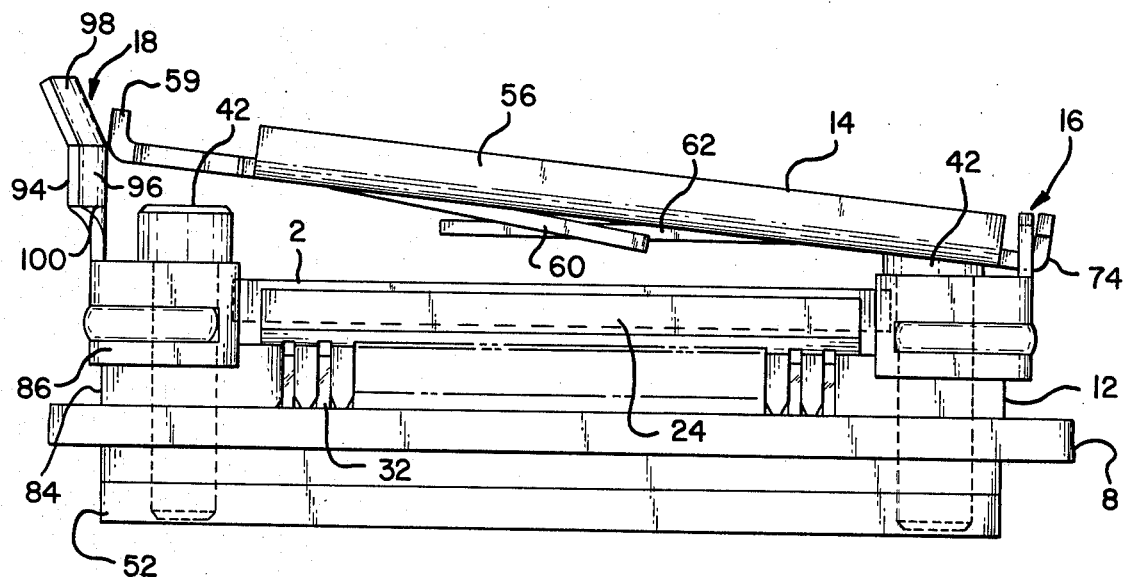
FIG. 5 is a side view of the connector assembly illustrating the positions the parts assume when the clamping lid is being lowered and the latch arms are flexed by the clamping lid to permit complete lowering of the lid.

Whan an integrated circuit package is to be placed in the connector assembly, the latch arms 90 are flexed normally of their own planes outwardly, as illustrated in FIG. 4, and the lid is moved arcuately upwardly so that the integrated circuit package can then be placed in the well 30 with the terminal pads on the underside of the substrate against the contact portions 34 of the terminals 32. The lid is then simply pushed downwardly and as it approaches its lowered position, the edge of the side rail 54 will move against the camming surfaces 98 on the free ends 94 of the latch arms 90, see FIG. 5. When the lid is pushed further downwardly from the position of FIG. 5, the latch arms will be flexed outwardly until the edge of the flange 59 on the side rail 54 is below the downwardly facing edges 100 of the latch arms at which time the latch arms will return to their normal positions, as shown in FIG. 2. Upon such return of the latch arms to their normal positions, the clamping lid will be retained in clamping relationship by virtue of the engagement of the edges 100 of the latch arms with the edge of the flange 59.

The latch arms 90 provide an extremely strong and reliable latching means for holding the lid in its closed position. The clamping lid exerts a substantial force on the edges 100 of the latch arms, but this force is directed vertically upwardly and would tend to cause the latch arms to flex parallel to their own planes, that is to be flexed vertically upwardly, as viewed in the drawing. However, the cantilever beams 90 are highly resistant to flexure in a vertical direction for the reason that their planes lie in a vertical plane and they are extremely stiff in this direction. On the other hand, the cantilever beams 90 will readily flex normally of their own planes, as shown in FIG. 4, to permit lowering or raising of the clamping lid.

An appreciation of the forces and stresses involved in a connector of the type shown can be obtained if it is pointed out that the housing 12 is relatively small, being only 24.13 mm on each side. The housing shown has 68 terminals therein, 17 terminals in each of the side frames, for engagement with the 68 terminal pads on the underside of the substrate and each terminal is designed to impose a contact force of greater than 200 gms on the substrate. The 68 terminals in the housing, thus impose a force of at least 13.6 kg, and the clamping lid springs must, therefore, be capable of developing this force. All of these forces are thus transmitted to the ends of the latch arms and through the flange 59 of the clamping lid to the latch arms.

The latch arms 90 can be flexed to a substantial extent, as shown in FIG. 4, when the IC package is being removed or placed in the connector and with reasonable handling, these latch arms will not be damaged. However, should they be damaged by overstressing as the result of abusive handling, they will simply not return to their normal positions and the edges 100 will not extend over the flange 54 of the clamping lid. Under such circumstances, the technician will immediately observe this fact and will replace the latch frame in the connector assembly. In this sense then, a latch means in accordance with the invention is "fail safe". Under some circumstances, it may be possible to bend a damaged latch arm inwardly so that even after overstressing, the latch arm can be restored to usefulness.

Figure 6:
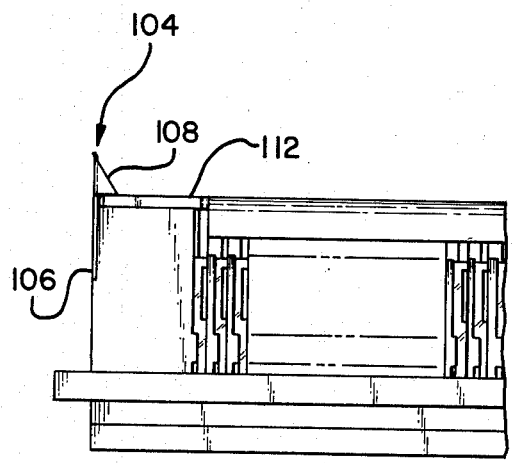
FIG. 6 is a fragmentary side view of a connector showing a known prior art type of latching means for connector clamping lid.
Figure 7:
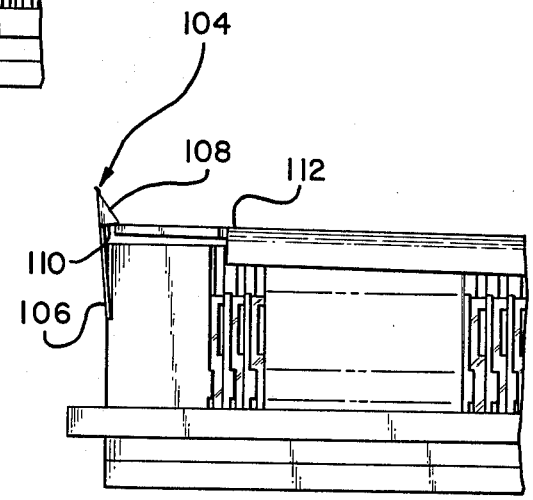
FIG. 7 is a view similar to FIG. 6 illustrating the condition which results when the latch arm is damaged as the result of abusive handling.

FIGS. 6 and 7 illustrate the type of problem which is sometimes encountered with prior art latching devices for IC package connectors. The latch arm in FIG. 6, 104, comprises a short flat strip 106 of sheet metal which is disposed against the surface of the connector housing. The length of this strip can be no greater than the height of the housing which is approximately 7 mm. At its upper end, ears 108 are provided on the strip 106 which extend inwardly and over the lid 112. The downwardly facing edges 110 of these ears thus bear against the lid 112 and retain it in its closed position on the housing. When the IC package is to be removed from the housing, the strips are flexed outwardly and normally of their own planes until the ears are beyond the edge of the lid.

Latching devices of the type shown in FIG. 6 will function in a satisfactory manner so long as the flat strip 106 is flush against the external surface of the housing, as shown in FIG. 6. However, when the strip is flexed normally of its plane away from the housing, as when an IC package is being removed from the housing, it can be severely overstressed if great care is not taken in handling it. As noted above, this strip is only about 7 mm long and is rigidly secured at its lower end to the housing. When the upper end having the ears 108 thereon is flexed away from the housing, overstressing will result if the strip is pushed too far away from the housing. When such overstressing takes place, the strip may return partially to its original position, as shown in FIG. 7, and the lower edges 110 of the ears 108 will extend obliquely with respect to the flange 59 of the lid and the effectiveness of the clamping ears is greatly reduced, so much so, that vibration or an abrupt jolt, may cause the ears to release their grip on the clamping lid.

I claim:

1. A connector assembly for establishing electrical connections with terminal pads on one surface of the substrate of an IC package, said connector assembly comprising a housing having an IC receiving face and laterally directed external side surfaces which extend normally of said IC receiving face, contact terminals in said housing which bear against said terminal pads of a substrate positioned on said face, a flat clamping lid in covering relationship to said IC receiving face for clamping said substrate against said contact terminals, and retaining means on said housing for removably holding said clamping lid on said housing, said connector assembly being characterized in that:

said retaining means comprises a pair of resilient sheet metal latch arms which are mounted on said housing proximate to one of said side surfaces and proximate to said IC receiving face of said housing, said latch arms comprising cantilever beams which extend in opposite direction alongside said one side surface of said housing.

said latch arms each having a retaining portion on its end disposed in a plane which is normal to the plane of said IC receiving face and which extends partially over marginal portions of said IC receiving face, said retaining portions having edge portions, defined by the thickness of said sheet metal latch arms, which are engagable with said clamping lid to retain said lid on said housing, said latch arms being flexible normally of their own planes and parallel to the plane of said IC receiving face whereby said retaining portions can be moved laterally beyond said one side surface thereby to permit placement of an IC package in, and removal of an IC package from, said connector assembly.

2. A connector assembly as set forth in claim 1, said clamping lid being hinged to said housing proximate to a second side surface of said housing which is opposite to said one side surface.

3. A connector assembly as set forth in claim 1, said retaining means further comprises a sheet metal retaining member secured to said housing proximate to said one side surface, an ear integral with said retaining member extending therefrom normally of said IC receiving face of said housing, said latch arms extending from said ear.

4. A connector assembly as set forth in either of claims 1 or 3, said substrate, said housing, and said clamping lid being rectangular.

5. A connector assembly as set forth in claim 4, said substrate, said housing, and said clamping lid being substantially square, said terminal pads on said substrate being arranged in rows which extend along all four marginal side portions of said one surface of said substrate.

6. A connector assembly as set forth in claim 5, said free ends of said cantilever beams having contoured surface portions which are engaged by said lid upon arcuate movement of said lid towards said IC receiving face, said contoured surface portions serving as camming surfaces which cause flexure of said beams thereby to permit movement of said lid against said IC receiving face.

* * * * *